US009516792B2

(12) United States Patent
Krishnan et al.

(10) Patent No.: US 9,516,792 B2
(45) Date of Patent: Dec. 6, 2016

(54) ULTRASOUND ASSISTED IMMERSION COOLING

(71) Applicant: Intel Corporation, Santa Clara, CA (US)

(72) Inventors: Shankar Krishnan, Portland, OR (US); Richard C. Stamey, Beaverton, OR (US); Brian S. Jarrett, Hillsboro, OR (US); Geoffrey G. Von Allmen, Brooklyn, NY (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/668,331

(22) Filed: Mar. 25, 2015

(65) Prior Publication Data
US 2016/0286694 A1 Sep. 29, 2016

(51) Int. Cl.
H05K 7/20 (2006.01)
G06F 1/20 (2006.01)

(52) U.S. Cl.
CPC ...... H05K 7/20772 (2013.01); H05K 7/20281 (2013.01)

(58) Field of Classification Search
CPC .. H05K 7/20; H05K 7/20345; H05K 7/20272; H05K 7/20263; H01L 23/44; H01L 23/427; H01L 23/473; F28F 13/00; F28F 13/02; F28D 5/00; G06F 1/20; G06F 1/206
USPC .............. 361/679.46, 679.53, 688, 689, 698, 699,361/700, 715, 719, 720–724; 165/80.2, 80.4, 165/80.5, 104.33, 185; 174/15.1, 16.3; 62/259.2; 257/714
See application file for complete search history.

(56) References Cited

U.S. PATENT DOCUMENTS

| | | | | |
|---|---|---|---|---|
| 5,943,211 A * | 8/1999 | Havey | ................. | H01L 23/427 165/80.4 |
| 6,247,525 B1 * | 6/2001 | Smith | ................. | B05B 7/0012 165/104.23 |
| 6,955,063 B2 * | 10/2005 | Adiga | ................. | F28D 5/00 165/80.4 |
| 7,092,254 B1 * | 8/2006 | Monsef | ................. | H01L 23/473 165/80.4 |
| 7,202,562 B2 * | 4/2007 | Farrar | ................. | H01L 23/44 257/713 |
| 7,489,034 B2 * | 2/2009 | Farrar | ................. | H01L 23/44 257/713 |
| 2006/0118949 A1 * | 6/2006 | Farrar | ................. | H01L 23/44 257/714 |

(Continued)

OTHER PUBLICATIONS

Phillip E. Tuma, "The Merits of Open Bath Immersion Cooling of Datacom Equipment", 26th IEEE SemiTherm Syposium, 2010, pp. 123-131, St. Paul, MN.

(Continued)

Primary Examiner — Michail V Datskovskiy
(74) Attorney, Agent, or Firm — Schwabe, Williamson & Wyatt, P.C.

(57) ABSTRACT

Apparatuses, methods and storage media associated with cooling one or more heat-generating components of an electronic device are disclosed herein. In embodiments, an electronic device may include a tank that may include a dielectric fluid and one or more heat-generating components. The electronic device may further include one or more transducers coupled with the tank. The transducers may be configured to generate an ultrasonic wave that controls movement of the dielectric fluid at a location within the tank. Other embodiments may be described and/or claimed.

13 Claims, 7 Drawing Sheets

(56) References Cited

U.S. PATENT DOCUMENTS

| | | | | |
|---|---|---|---|---|
| 2007/0023894 A1* | 2/2007 | Farrar | .................... | H01L 23/44 |
| | | | | 257/714 |
| 2012/0024867 A1* | 2/2012 | Laugharn, Jr. | .......... | F28F 13/00 |
| | | | | 220/592.01 |
| 2015/0245539 A1* | 8/2015 | Pelletier | .................. | G06F 1/206 |
| | | | | 361/679.53 |

OTHER PUBLICATIONS

Legay et al., "Enhancement of Heat Transfer by Ultrasound:Review and Recent Advances", International Journal of Chemical Engineering, 2011, 18 pages, vol. 2011, Article ID 6070108, Hindawi Publishing Corporation.

\* cited by examiner

Non-transitory computer-readable storage medium 702

Programming Instructions 704
Configured to cause a device, in response to execution of the programming instructions, to practice (aspects of) embodiments of the process of Figure 5.

Figure 7

ULTRASOUND ASSISTED IMMERSION COOLING

TECHNICAL FIELD

The present disclosure relates to the field of thermal cooling for electronic devices, and specifically to immersion cooling.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

Legacy air cooled data centers may suffer from one or more limitations, for example, limited energy efficiency, low component density, lack of waste heat recovery capability, high operating costs, and/or a high data center footprint. On the other hand, liquid cooling may offer the benefits of increased energy efficiency, higher component density, enablement of waste heat recovery, and relatively low operating cost. However, the benefits of liquid cooling may be offset by the large initial capital expenditure needed to retrofit existing air cooled installations, as well as reliability concerns over bringing a fluid such as water close to electronic components.

Therefore, immersion cooling methods that may use different types of dielectric fluids such as mineral oil may offer increased energy efficiency benefits. However, the immersion cooling methods may still have challenges around high fluid cost or serviceability. Also, single phase immersion cooling technologies may have poor heat transfer characteristics owing to a relatively high Prandtl number associated with dielectric fluids. For example the Prandtl number associated with the dielectric fluids may be higher than the Prandtl number of air, which may be approximately 0.7.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 7 illustrates a storage medium having instructions for practicing processes described with reference to FIG. 5, according to disclosed embodiments.

DETAILED DESCRIPTION

Figure 1:
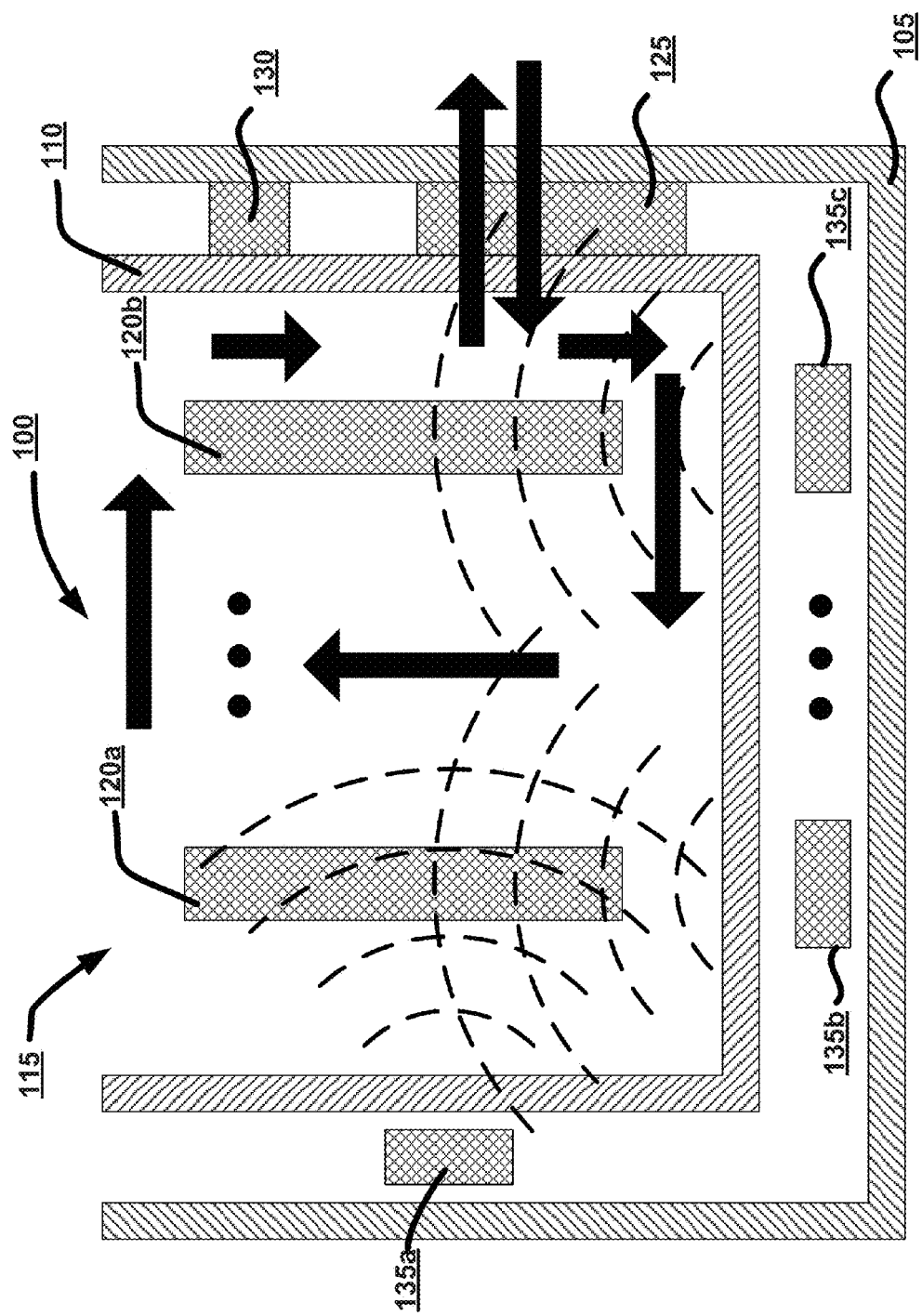
FIG. 1 illustrates a high-level schematic view of an electronic system with transducer assisted immersion cooling, in accordance with various embodiments.

Apparatuses, methods and storage media associated with cooling one or more heat-generating components of an electronic device are disclosed herein. In embodiments, an electronic device may include a tank that may include a dielectric fluid and one or more heat-generating components. The electronic device may further include one or more transducers coupled with the tank. The transducers may be configured to generate an ultrasonic wave that may result in a pressure wave to control movement of the dielectric fluid at a location within the tank. Other embodiments may be described and/or claimed.

The disclosed immersion cooling approach may be a viable alternative to relatively expensive all-liquid cold plate-based solutions. Particularly, memory stacked on common central processing unit (CPU) architectures may require localized cooling approaches that dissipate heat at local CPU and/or memory stack level while simplifying system level integration. The disclosed system, by contrast, may operate at a rack-scale level, chassis level, blade level, or some other level, and eliminate a significant portion of the cost of traditional cold plate-based liquid cooled systems such as quick disconnects, heatsinks/spreaders, cold plates, etc. In some embodiments, the disclosed immersion cooling approach may be used in combination with one or more other approaches such as an all-liquid cold plate-based solution, an air-cooled solution, or some other approach.

As discussed herein, electrical and/or optical components may include components such as processors, central processing units (CPUs), memory such as dynamic random access memory (DRAM), flash memory, dual inline memory modules (DIMMs), logic, a peripheral component interconnect express (PCIe) card, an audio chip, a graphics chip, read-only memory (ROM), a wired or wireless communication chipset, a hard disk drive (HDD), or other components. It will be understood that the above description of electrical and/or optical components is intended as a non-exhaustive list of descriptive examples, and additional or alternative components to those listed above may be used in other embodiments. The electrical and/or optical components may be generically referred to herein as heat-generating components.

In the following detailed description, reference is made to the accompanying drawings that form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Aspects of the disclosure are disclosed in the accompanying description. Alternate embodiments of the present disclosure and their equivalents may be devised without parting from the spirit or scope of the present disclosure. It should be noted that like elements disclosed below are indicated by like reference numbers in the drawings.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

FIG. 1 illustrates a high-level schematic view of an electronic system 100 with transducer assisted immersion cooling, in accordance with various embodiments. Specifically, for ease of understanding, the depiction of system 100 in FIG. 1 is intended as a simplified view of the system 100, and in some embodiments the system 100 may have additional electrical or communicative connecting elements. In embodiments, the system 100 may include an outer wall 105 and an inner wall 110 defining a tank 115. The tank 115 may be configured to hold a dielectric fluid such as mineral oil, Novec™ such as that manufactured by 3M™, Solvay™ manufactured fluids, or some other fluid and/or incompressible liquid, and various heat generating components. Although shown only having walls on three sides, the system 100 may be enclosed or otherwise sealed in some embodiments, while in other embodiments the system 100 may be open as shown in FIG. 1. Additionally, the outer wall 105 and the inner wall 110 may have a different configuration from that shown in FIG. 1.

In some embodiments, the system 100 may include one or more heat-generating components 120a and 120b (collectively referred to as heat-generating components 120) disposed within the tank 115 and immersed in the dielectric fluid. In some embodiments, the heat-generating components 120 may be or include the electrical and/or optical components as described above. In some embodiments, the heat-generating components 120 may be one or more circuit boards that include one or more of the electrical and/or optical components described above. The one or more heat-generating components 120 may be coupled with or otherwise attached to, for example, a backplane that is physically coupled with or otherwise attached to the outer wall 105 and/or the inner wall 110. The heat-generating components 120 may be fully or partially submerged in the dielectric fluid.

The system 100 may further include a heat exchanger 125 configured to cool dielectric fluid in the tank 115, i.e. remove heat from the dielectric fluid in the tank 115. For example, in some cases the heat exchanger 125 may remove heat from existing dielectric fluid in the tank 115, while in other embodiments the heat exchanger 125 may remove heated dielectric fluid from the tank 115 and introduce new cooler dielectric fluid, or remove heat from the removed dielectric fluid and reintroduce the now-cooled dielectric fluid back into the tank 115. Additionally, the system 100 may include a fluid pump 130 which may generate some motion of the fluid. In some embodiments, the fluid pump 130 may be part of or otherwise coupled to the heat exchanger 125.

The system may further include one or more transducers 135a, 135b, and 135c (collectively referred to as transducers 135) generally positioned between the outer wall 105 and the inner wall 110. The transducers 135 may be configured to provide an ultrasonic wave with a frequency of between approximately 25 and 50 kilohertz (kHz). In some embodiments, the ultrasonic wave may have a frequency between approximately 20 kHz and a few 10s of megahertz (MHz) such as 30 MHz. In other embodiments, the transducers 135 may be configured to provide a higher or lower frequency. As shown in FIG. 1, the transducers 135 may be included on two sides of the system 100. However, in other embodiments the transducers may be on additional or alternative sides of the system 100. For example, the transducers may be on the top, bottom, sides, front, and/or back of the system 100.

The transducers 135 may generate an ultrasonic wave that may cause the dielectric fluids within the tank 115 to move. For example, FIG. 1 depicts the ultrasonic wave as dashed lines emanating from each of the transducers 135. The solid black arrows depicted in FIG. 1 are intended to show an example of the fluid motion within the tank 115. Generally, this embodiment may be based on an Eckart acoustic streaming approach wherein the sound is attenuated in the bulk of the dielectric fluid by Reynolds-stress like mechanisms, for example, turbulent energy dissipation. Eckart streaming may refer to the dissipation of acoustic energy in a fluid. Generally, the acoustic waves created due to Eckart streaming are considered to be progressive and attenuated waves. As used herein, progressive may refer to a characteristic wherein the acoustic waves generate a ripple in the dielectric fluids that grows over time. Attenuation may refer to a characteristic wherein the energy of the acoustic waves is absorbed by the fluid over time. Generally, the motion of the dielectric fluid based on the ultrasonic waves may be proportional to the sound intensity and/or attenuation coefficient of sound in the dielectric fluid. Therefore, for a given dielectric fluid, fluid velocity may be increased by increasing the intensity of the ultrasonic wave. Generally, the sound intensity of the wave may have a square dependence on ultrasound power. In other words, the velocity of the wave may be proportional to the square root of the power of the ultrasound wave.

As shown in FIG. 1, the ultrasonic waves produced by the transducers 135 may be configured to cause fluid motion at a specific position or area within the tank 115, such that the dielectric fluid flows to or from the specific position or area. For example, it may be specifically desirable to cool heat-generating component 120a. As shown in FIG. 1, the ultrasonic waves of transducers 135a and 135b may intersect in the general vicinity of heat-generating component 120a. By varying the power intensity of the ultrasonic wave of transducers 135a and 135b, the motion of the fluid near heat-generating component 120a may be directed. In some embodiments, the ultrasonic waves generated by transducers 135a and 135b may cause cavitation of the dielectric fluid in the vicinity of heat-generating component 120a, which may result in movement of the dielectric fluid within the vicinity of heat-generating component 120a. Specifically, the fluid within the tank 115 may be caused by the ultrasonic waves to move in an intended fashion at a specific point within the tank, rather than just generally move within the tank in a fashion that could be caused, for example, by a fluid pump such as fluid pump 130.

Figure 2:
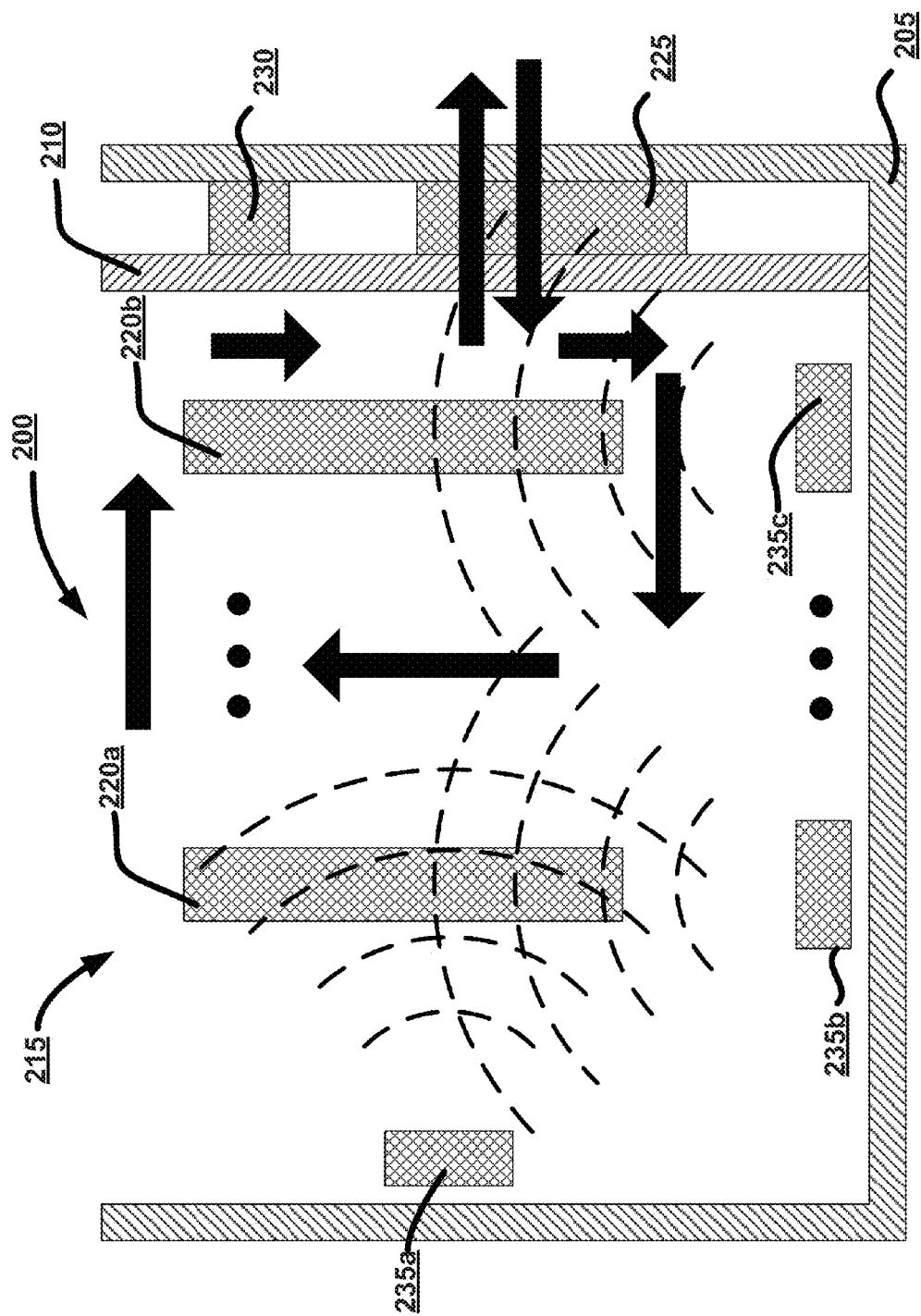
FIG. 2 illustrates an alternative high-level schematic view of an electronic system with transducer assisted immersion cooling, in accordance with various embodiments.

FIG. 2 illustrates an alternative high-level schematic view of an electronic system 200 with transducer assisted immersion cooling, in accordance with various embodiments. In embodiments, the system 200 may include elements similar to those of system 100, and said similar elements may be numbered similarly to those depicted in FIG. 1. For example, the system 200 may include outer wall 205, inner wall 210, heat-generating components 220, fluid pump 230, and heat exchanger 225, which may be respectively similar to outer wall 105, inner wall 110, heat-generating components 120, fluid pump 130, and heat exchanger 125. In the embodiment depicted in FIG. 2, however, transducers 235 may be located within the fluid tank 215, rather than disposed between the inner wall and the outer wall of the system as depicted in FIG. 1.

In embodiments, the transducers 235 may enable Schlichting streaming of the dielectric fluid. Schlichting streaming may refer to the motion of the dielectric fluid close to one or more of the heat-generating components 220. In the system 200 depicted in FIG. 2, the ultrasonic waves generated by transducers 235 may be used to create standing waves within the dielectric fluid by interacting with the heat-generating components 220, and/or the walls 205/210 of the system 200. This approach may result in thinning the boundary layer and the boundary layer thickness. Specifically, the dielectric fluid may have a boundary layer near the wall of the heat-generating components 220 and/or the walls 205/210 of the system 200, wherein dielectric fluid within the boundary layer is generally motionless. Because the dielectric fluid is generally motionless, it may not carry heat away from, for example, one or more of the heat-generating components 220. However, by reducing the thickness of the boundary layer, a larger amount of the dielectric fluid may move in an area closer to the heat-generating components 220 and/or the walls 205/210, thereby carrying a larger amount of thermal energy from the heat-generating components 220 and/or walls 205/210. Generally, the boundary layer thickness may be defined as $(2\upsilon/\omega)^{0.5}$ where $\upsilon$ may refer to the kinematic viscosity of the dielectric fluid and $\omega$ may refer to the pulsation of the ultrasonic wave. It can be seen that as $\omega$ increases, the boundary layer thickness may decrease as a result.

Figure 3:
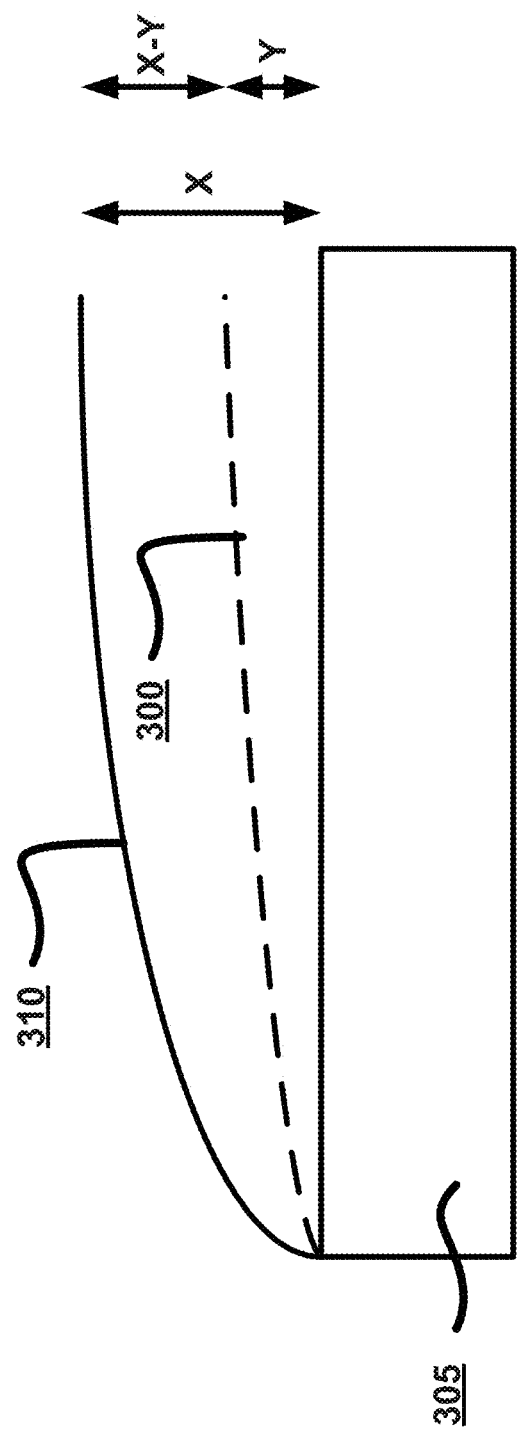
FIG. 3 illustrates an example of heat transfer augmentation using ultrasound, in accordance with various embodiments.

FIG. 3 depicts a graphical example of boundary layer thickness. The dielectric fluid may have a boundary layer 300 that is some distance x away from a physical object 305. The physical object 305 may be, for example, a heat-generating component such as heat-generating components 120 and/or 220, or a wall of a system such as walls 105, 110, 205, and/or 210. By generating an ultrasonic wave that reduces the boundary layer as described above, the boundary layer 300 may be shifted closer to the physical object 305, for example, as illustrated by boundary layer 310. As can be seen in FIG. 3, boundary layer 310 may generally be viewed as being a distance y away from the physical object 305, where y<x. Therefore, dielectric fluid may move in the area designated x-y, thereby removing a greater amount of thermal energy from object 305.

It will be understood that the two examples provided above with respect to systems 100 and 200 are intended as non-limiting examples. For example, in some embodiments a greater or lesser number of transducers 135 or 235 and/or heat-generating components 120 and 220 may be used in systems 100 and 200, as indicated by the ellipses in FIGS. 1 and 2. In some embodiments, the transducers 235 within the tank 215 may be used in conjunction with transducers such as transducers 135 outside of a tank such as tank 115, thereby acquiring the benefits of both Eckart and Schlichting streaming.

In some embodiments, the systems 100 or 200 may be a rack scale component such as a blade server. Specifically, the system 100 or 200 may be a blade server, and the heat-generating components 120 or 220 may be specific components of the blade server such as one or more of the electrical and/or optical components described above. For example, the heat-generating components 120 or 220 may include memory stacked on a CPU architecture that may require localized cooling approaches to dissipate heat at local CPU and/or memory stack level while simplifying system level integration. In other embodiments, the systems 100 or 200 may be chassis scale components such as a server chassis. In these embodiments, the heat-generating components 120 or 220 may be a blade server. In other embodiments, the systems 100 or 200 may be rack scale components such as a server rack. The server rack may include a one or more chassis, each with one or more blade servers. In these embodiments, the heat-generating components 120 or 220 may be a blade server, a chassis, or some other type of heat-generating component. A feature of the present disclosure is that the disclosure may be scalable in different embodiments to different system or component sizes or levels. As noted above, in some embodiments, the disclosed immersion cooling approach may be used in combination with one or more other approaches such as an all-liquid cold plate-based solution, an air-cooled solution, or some other approach.

System design of electronic systems such as systems 100 or 200 may include determination of the appropriate power density of heat-generating components such as components 120 or 220, the number of transducers such as transducers 135 or 235 to be used, and the placement of the transducers 135 or 235 in relation to the tank 115 or 215 for maximum heat transfer augmentation. Additionally, system firmware may need to be updated to comprehend the implementation of transducer assisted cooling. For example, system firmware related to traditional air cooling approaches may not be able to be directly employed for an immersion cooled environment.

A number of implementation strategies may be employed to improve the energy efficiency of a system such as systems 100 or 200 that take advantage of ultrasound assisted immersion cooling. For example, in some embodiments the transducers 135 or 235 may be positioned such that they are aligned to generate constructive interference, thereby enabling turbo cooling. Additionally, in some embodiments the transducers may be aligned or configured such that they may be used during degraded system performance, for example, if one of the heat-generating components 120 or 220 is experiencing a particularly heavy workload and generating an increased amount of thermal energy. Degraded performance may also be experienced if one or more alternative cooling elements, for example, fluid pumps 130 or 230, mechanically fail. Additionally, the ultrasound assisted immersion cooling may be used during near-thermal design point (TDP) workloads. In some embodiments, the ultrasound assisted immersion cooling approach may be used in the case of workloads that generate power above a pre-defined or dynamic threshold.

Embodiments of the present disclosure may also be used in addition to or in place of other cooling solutions such as heatsinks that may be relatively expensive. For example, for immersion cooled environments that include a thermal interface material and a heatsink material, the material choices may be limited due to potential interaction with the dielectric fluid. Therefore, use of the heatsinks with the potentially reactive materials may add cost to the system. By augmenting or replacing the relatively expensive heatsinks with embodiments of the present disclosure, the cost of the system may be reduced.

Alternatively, in some systems such as systems 100 or 200, the transducers 135 or 235 may be relatively low power such that they may be used continuously with an immersion cooled system that employs heatsink solutions. Such heatsinks solutions may include polymer-based heatsinks, extruded aluminum-based heatsinks, or other heatsinks. For example, if the heat-generating components 120 or 220 are blade servers, then thermal management of the blades during degraded performance of the system 100 or 200 may be achieved by creating a profile for known power consumption and temperature of components of the blades. For example, the profile may include known power consumption or temperature of a CPU, memory, or some other type of electrical and/or optical component coupled with the blade servers. During normal operation, the heatsinks may be sufficient to cool the electrical and/or optical components. However, any deviation from the power or temperature profiles may cause one or more of the transducers 135 or 235 to operate and assist with cooling the system 100 or 200.

In addition to cooling applications, the transducers 135 or 235 may additionally be used for cleaning the system 100 or 200. For example, dielectric fluids may cause damage to plasticizers such that the plasticizers end up depositing in holes or small pores. The plasticizers may clog up, for example, boiling enhancement coating used in two phase immersion cooled systems. The transducers 135 or 235 may be integrated with firmware or data center managers to provide system maintenance for cleaning one or more of printed circuit boards (PCBs) during operation of the systems, servicing fluid filters and the immersion baths, and/or cleaning heatsinks during operation when the heatsinks become clogged. For example, strategically placed ultrasound transducers may induce cavitation bubbles that may clear deposited sediments in pores or holes. Further, enabling reverse flow in the loop using engineered transducers may clear deposits in filtration or other flow paths.

Figure 4:
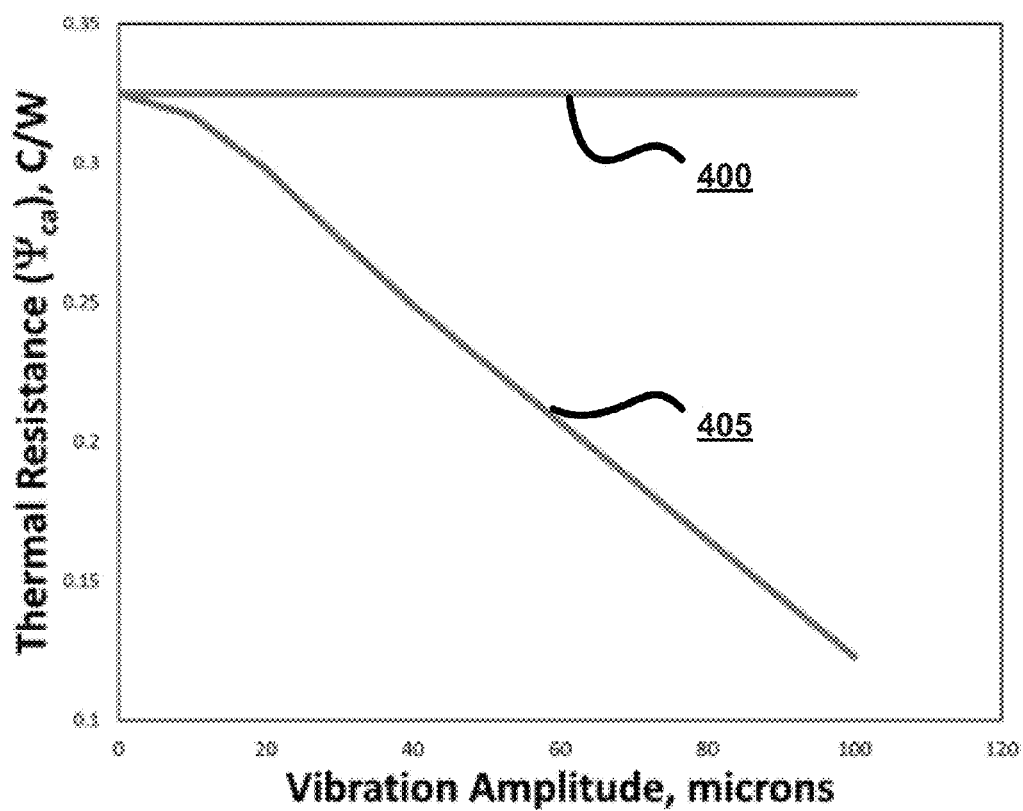
FIG. 4 illustrates an example of a change in the heat transfer boundary layer based on ultrasound assisted cooling, in accordance with various embodiments.

FIG. 4 depicts an example showing the benefits of use of the transducers 135 of system 100. Line 400 may depict the thermal resistance of the fluid in the tank 115 when the transducers 135 are not operational. By contrast, line 405 may depict the thermal resistance of the fluid as the transducers generate ultrasonic waves. It can be seen that as the amplitude of the ultrasonic waves increases, the thermal resistance of the fluid decreases. As the magnitude of the amplitude increases, velocity of the fluid may increase, which may result in an increase in the heat carrying capacity of the fluid. Additionally, the thermal resistance decrease depicted by line 405 may correlate to junction temperature of the one or more heat generating components 120. Reduction in junction temperature may reduce the leakage power consumption of the one or more heat-generating components 120.

Figure 5:
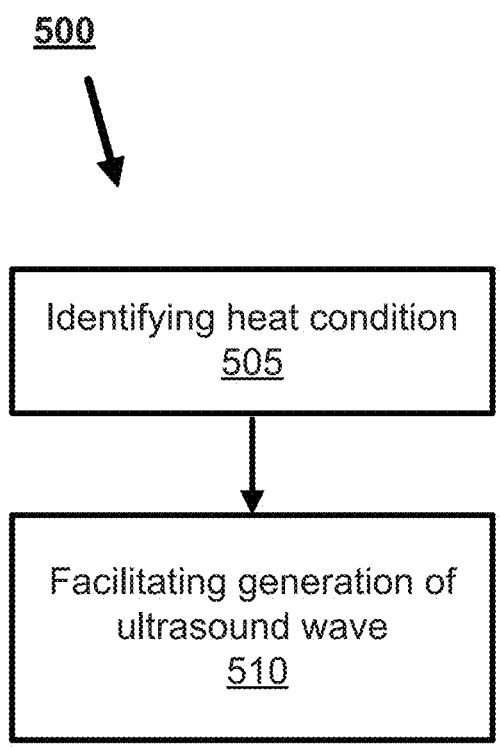
FIG. 5 illustrates an example process of ultrasound assisted immersion cooling, in accordance with various embodiments.

FIG. 5 illustrates an example process 500 of ultrasound assisted immersion cooling, in accordance with various embodiments. The process 500 may be performed by logic or circuitry coupled with one or more of the transducers 135 or 235 of systems 100 or 200. In embodiments, the process 500 may include identifying the presence of a heat condition at 505. The heat condition may be, for example, an increased workload of one or more of the heat-generating components, a desire to activate turbo cooling, degraded performance of one or more components of the system, or variation from a known power or temperature profile as described above. Based on the identification of 505, the process 500 may then include facilitating the generation of an ultrasound wave at 510. The ultrasound wave may be generated, for example, by one or more of transducers 135 or 235. Specifically, the transducers may be directed to generate the ultrasound waves such that motion of the dielectric fluid at an intended location within a tank such is caused.

Figure 6:
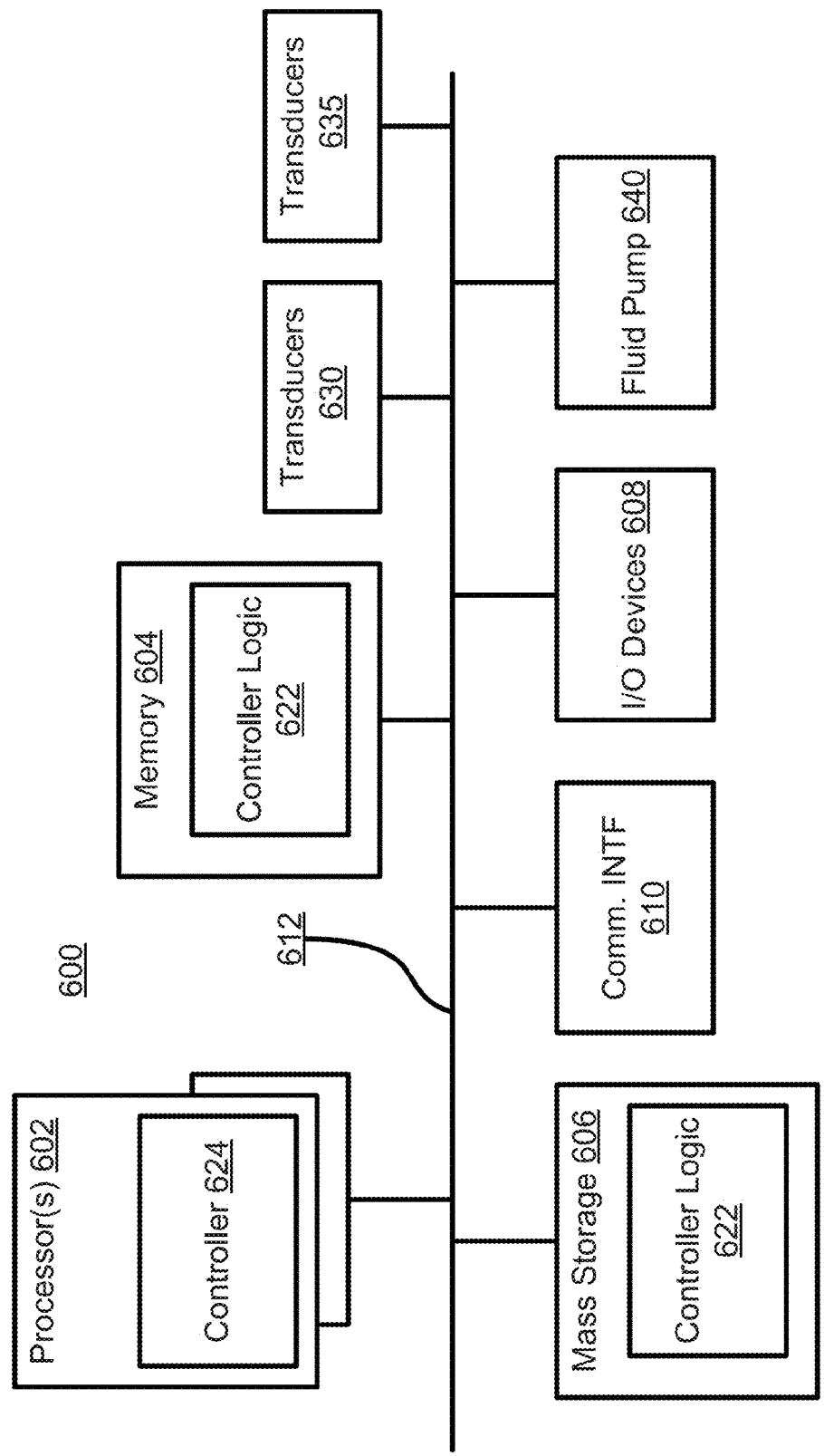
FIG. 6 illustrates an example computer system suitable for use to practice various aspects of the present disclosure, according to the disclosed embodiments.

FIG. 6 illustrates an example electronic device 600 (e.g., a computer, a server, or some other electronic device) that may be suitable to practice selected aspects of the present disclosure. As shown, electronic device 600 may include one or more processors or processor cores 602 and system memory 604. For the purpose of this application, including the claims, the terms "processor" and "processor cores" may be considered synonymous, unless the context clearly requires otherwise. Additionally, electronic device 600 may include mass storage devices 606 (such as diskette, hard drive, compact disc read-only memory (CD-ROM) and so forth), input/output (I/O) devices 608 (such as display, keyboard, cursor control and so forth) and communication interfaces 610 (such as network interface cards, modems and so forth). The elements may be coupled to each other via system bus 612, which may represent one or more buses. In the case of multiple buses, they may be bridged by one or more bus bridges (not shown). Additionally, or alternatively, electronic device 600 may also include one or more transducers 630, a tank 635, and/or a fluid pump 640 which may be similar to transducers 135/235, tank 115/215, and/or fluid pump 130/230, respectively. In embodiments, the processor(s) 602 may be or include one or more of the controllers 624 configured to perform the operations described above with respect to FIG. 5.

Each of these elements may perform its conventional functions known in the art. In particular, in some embodiments, system memory 604 and mass storage devices 606 may be employed to store a working copy and a permanent copy of the programming instructions configured to cooperate with controllers 624 to perform the operations associated with the immersion cooling process of FIG. 5, earlier described, collectively referred to as controller logic 622. The various elements may be implemented by assembler instructions supported by processor(s) 602 or high-level languages, such as, for example, C, that can be compiled into such instructions.

The number, capability and/or capacity of these elements 610-612 may vary, depending on whether electronic device 600 is used as a blade in a rack server, as a stand-alone server, or as some other type of electronic device such as a client device. When used as a client device, the capability and/or capacity of these elements 610-612 may vary, depending on whether the client device is a stationary or mobile device, like a smartphone, computing tablet, ultrabook or laptop. Otherwise, the constitutions of elements 610-612 may be known, and accordingly will not be further described. When used as a server device, the capability and/or capacity of these elements 610-612 may also vary, depending on whether the server is a single stand-alone server or a configured rack of servers or a configured rack of server elements.

As will be appreciated by one skilled in the art, the present disclosure may be embodied as methods or computer program products. Accordingly, the present disclosure, in addition to being embodied in hardware or logic as earlier described, may take the form of an entire software embodiment (including firmware, resident software, micro-code, etc.) or an embodiment combining software and hardware aspects that may all generally be referred to as a "circuit," "module" or "system." Furthermore, the present disclosure may take the form of a computer program product embodied in any tangible or non-transitory medium of expression having computer-usable program code embodied in the medium. FIG. 7 illustrates an example computer-readable non-transitory storage medium that may be suitable for use to store instructions that cause an apparatus, in response to execution of the instructions by the apparatus, to practice selected aspects of the present disclosure. As shown, non-transitory computer-readable storage medium 702 may include a number of programming instructions 704. Programming instructions 704 may be configured to enable a device, e.g., electronic device 600, in response to execution of the programming instructions, to perform, e.g., various operations associated with the immersion cooling process of FIG. 5. In alternate embodiments, programming instructions 704 may be disposed on multiple computer-readable non-transitory storage media 702 instead. In alternate embodiments, programming instructions 704 may be disposed on computer-readable transitory storage media 702, such as signals.

Any combination of one or more computer-usable or computer-readable medium(s) may be utilized. The computer-usable or computer-readable medium may be, for example, but is not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or flash memory), an optical fiber, a portable compact disc read-only memory (CD-ROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer-usable program code may be transmitted using any appropriate medium, including but not limited to wireless, wireline, optical fiber cable, radio frequency (RF), etc.

Computer program code for carrying out operations of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present disclosure is described with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means that implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions that execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the disclosure. As used herein, the singular forms "a," "an" and "the" are intended to include plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments may be implemented as a computer process, a computing system or an article of manufacture such as a computer program product of computer-readable media. The computer program product may be a computer storage medium readable by a computer system and encoding computer program instructions for executing a computer process.

The corresponding structures, material, acts, and equivalents of all means or steps plus function elements in the claims below are intended to include any structure, material or act for performing the function in combination with other claimed elements that are specifically claimed. The description of the present disclosure has been presented for purposes of illustration and description, but is not intended to be exhaustive or limited to the disclosure in the form disclosed. Many modifications and variations will be apparent to those of ordinary skill without departing from the scope and spirit of the disclosure. The embodiment was chosen and described in order to best explain the principles of the disclosure and the practical application, and to enable others of ordinary skill in the art to understand the disclosure for embodiments with various modifications as are suited to the particular use contemplated.

Referring back to FIG. 6, for one embodiment, at least one of processors 602, and specifically the controller 624, may be packaged together with memory having controller logic 622 (in lieu of storing on memory 604 and storage 606). For one embodiment, at least one of processors 602 may be packaged together with memory having controller logic 622 to form a System in Package (SiP). For one embodiment, at least one of processors 602 may be integrated on the same die with memory having controller logic 622. For one embodiment, at least one of processors 602 may be packaged together with memory having controller logic 622 to form a System on Chip (SoC). For at least one embodiment, the SoC may be utilized in, e.g., but not limited to, a smartphone or computing tablet.

Thus various example embodiments of the present disclosure have been described including, but not limited to:

Example 1 may include an apparatus comprising: a tank to hold a dielectric fluid and one or more heat-generating components; and a transducer coupled with the tank, the transducer to generate an ultrasound wave that controls movement of the dielectric fluid at a location within a vicinity of at least one of the one or more heat-generating components within the tank.

Example 2 may include the apparatus of example 1, wherein the transducer is located within the tank and the ultrasound wave is to control the movement of the dielectric fluid via Schlichting streaming.

Example 3 may include the apparatus of example 1, wherein the transducer is located external to the tank and the ultrasound wave is to control the movement of the dielectric fluid via Eckart acoustic streaming such that energy of the ultrasound wave is attenuated in the dielectric fluid via Reynolds-stress like mechanisms.

Example 4 may include the apparatus of example 1, further comprising a pump coupled with the tank, the pump to cause movement of the dielectric fluid within the tank.

Example 5 may include the apparatus of any of examples 1-4, wherein the apparatus is a blade server.

Example 6 may include the apparatus of any of examples 1-4, wherein the apparatus is a chassis that includes a plurality of blade servers.

Example 7 may include the apparatus of any of examples 1-4, wherein the apparatus is a rack that includes a plurality of chassis with respective pluralities of blade servers.

Example 8 may include the apparatus of any of examples 1-4, wherein the transducer is to generate an ultrasound wave with a frequency between 20 kilohertz and 30 Megahertz.

Example 9 may include the apparatus of any of examples 1-4, wherein the transducer is further to generate an ultrasound wave to clean the one of the one or more heat-generating components within the tank.

Example 10 may include the apparatus of any of examples 1-4, wherein one of the one or more heat-generating components includes a processor, a central processing unit (CPU), or a memory stack, and the tank includes the dielectric fluid and the processor, the central processing unit (CPU), or the memory stack.

Example 11 may include a system comprising: a tank comprising one or more heat-generating components immersed in a dielectric fluid; one or more transducers coupled with the tank; and logic coupled with the one or more transducers, the logic to cause the transducers to generate an ultrasound wave to cause movement of the dielectric fluid at a controlled location within a vicinity of one of the one or more heat-generating components.

Example 12 may include the system of example 11, wherein the transducer is coupled with the tank at a position within the tank.

Example 13 may include the system of example 11, wherein the transducer is coupled with the tank at a position external to the tank.

Example 14 may include the system of any of examples 11-13, wherein the apparatus is a blade server, a chassis that includes a plurality of blade servers, or a rack that includes a plurality of chassis with respective pluralities of blade servers.

Example 15 may include the system of any of examples 11-13, wherein the logic is to cause generation of an ultrasound wave with a frequency between 20 kilohertz and 30 Megahertz.

Example 16 may include one or more non-transitory computer-readable media comprising instructions to cause an electronic device, upon execution of the instructions by one or more processors of the electronic device, to: identify a heat condition associated with a heat-generating component immersed in a dielectric fluid in a tank; and facilitate generation, by one or more transducers, of an ultrasound wave to cause controlled movement of the dielectric fluid at a location in a vicinity of the heat-generating component.

Example 17 may include the one or more non-transitory computer-readable media of example 16, wherein the apparatus is a blade server, a chassis that includes a plurality of blade servers, or a rack that includes a plurality of chassis with respective pluralities of blade servers.

Example 18 may include the one or more non-transitory computer-readable media of examples 16 or 17, wherein to facilitate generation comprises to facilitate generation of an ultrasound wave with a frequency between 20 kilohertz and 30 Megahertz.

Example 19 may include the one or more non-transitory computer-readable media of examples 16 or 17, wherein to identify a heat condition comprises to identify a heat condition, a power condition, or a workload condition.

Example 20 may include a method comprising: identifying, by logic of an apparatus, a heat condition associated with a heat-generating component immersed in a dielectric fluid in a tank; and facilitating, by the logic, generation by one or more transducers an ultrasound wave to cause controlled movement of the dielectric fluid at a location in a vicinity of the heat-generating component.

Example 21 may include the method of example 20, wherein the apparatus is a blade server.

Example 22 may include the method of example 20, wherein the apparatus is a chassis that includes a plurality of blade servers.

Example 23 may include the method of example 20, wherein the apparatus is a rack that includes a plurality of chassis with respective pluralities of blade servers.

Example 24 may include the method of any of examples 20-23, wherein facilitating generation comprises facilitating generation of an ultraso und wave with a frequency between 20 kilohertz and 30 Megahertz.

Example 25 may include the method of any of example 20-23, wherein identifying a heat condition comprises identifying a heat condition, a power condition, or a workload condition.

Example 26 may include an apparatus comprising: means to identify a heat condition associated with a heat-generating component immersed in a dielectric fluid in a tank; and means to facilitate generation by one or more transducers an ultrasound wave to cause controlled movement of the dielectric fluid at a location in a vicinity of the heat-generating component.

Example 27 may include the apparatus of example 26, wherein the apparatus is a blade server.

Example 28 may include the apparatus of example 26, wherein the apparatus is a chassis that includes a plurality of blade servers.

Example 29 may include the apparatus of example 26, wherein the apparatus is a rack that includes a plurality of chassis with respective pluralities of blade servers.

Example 30 may include the apparatus of any of examples 26-29, wherein the means to facilitate generation comprise means to facilitate generation of an ultrasound wave with a frequency between 20 kilohertz and 30 Megahertz.

Example 31 may include the apparatus of any of examples 26-29, wherein the means to identify a heat condition comprise means to identify a heat condition, a power condition, or a workload condition.

It will be apparent to those skilled in the art that various modifications and variations can be made in the disclosed embodiments of the disclosed device and associated methods without departing from the spirit or scope of the disclosure. Thus, it is intended that the present disclosure covers the modifications and variations of the embodiments disclosed above provided that the modifications and variations come within the scope of any claims and their equivalents.

What is claimed is:

1. An apparatus comprising:
   a tank to hold a dielectric fluid and one or more heat-generating components; and
   a transducer located external to and coupled with the tank, the transducer to generate an ultrasound wave that controls movement of the dielectric fluid at a location within a vicinity of at least one of the one or more heat-generating components within the tank.

2. The apparatus of claim 1, wherein the ultrasound wave is to control the movement of the dielectric fluid via Schlichting streaming.

3. The apparatus of claim 1, wherein the ultrasound wave is to control the movement of the dielectric fluid via Eckart acoustic streaming such that energy of the ultrasound wave is attenuated in the dielectric fluid via Reynolds-stress like mechanisms.

4. The apparatus of claim 1, further comprising a pump coupled with the tank, the pump to cause movement of the dielectric fluid within the tank.

5. The apparatus of claim 1, wherein the apparatus is a blade server.

6. The apparatus of claim 1, wherein the apparatus is a chassis that includes a plurality of blade servers.

7. The apparatus of claim 1, wherein the apparatus is a rack that includes a plurality of chassis with respective pluralities of blade servers.

8. The apparatus of claim 1, wherein the transducer is to generate an ultrasound wave with a frequency between 20 kilohertz and 30 Megahertz.

9. The apparatus of claim 1, wherein the transducer is further to generate an ultrasound wave to clean the one of the one or more heat-generating components within the tank.

10. The apparatus of claim 1, wherein one of the one or more heat-generating components includes a processor, a central processing unit (CPU), or a memory stack, and the tank includes the dielectric fluid and the processor, the central processing unit (CPU), or the memory stack.

11. A system comprising:
    a tank comprising one or more heat-generating components immersed in a dielectric fluid;
    one or more transducers coupled with the tank at a position external to the tank; and
    logic coupled with the one or more transducers, the logic to control the transducers to generate an ultrasound wave to cause movement of the dielectric fluid at a controlled location within a vicinity of one of the one or more heat-generating components.

12. The system of claim 11, wherein the apparatus is a blade server, a chassis that includes a plurality of blade servers, or a rack that includes a plurality of chassis with respective pluralities of blade servers.

13. The system of claim 11, wherein the logic is to cause generation of an ultrasound wave with a frequency between 20 kilohertz and 30 Megahertz.

* * * * *